United States Patent
Stengl et al.

(10) Patent No.: US 7,199,373 B2
(45) Date of Patent: *Apr. 3, 2007

(54) PARTICLE-OPTIC ELECTROSTATIC LENS

(75) Inventors: Gerhard Stengl, Wernberg (AT);
Herbert Buschbeck, Vienna (AT);
Gertraud Lammer, Vienna (AT)

(73) Assignee: IMS Nanofabrication GmbH, Vienna (AT)

( * ) Notice: Subject to any disclaimer, the term of this patent is extended or adjusted under 35 U.S.C. 154(b) by 91 days.

This patent is subject to a terminal disclaimer.

(21) Appl. No.: 10/951,087

(22) Filed: Sep. 27, 2004

(65) Prior Publication Data

US 2005/0072933 A1 Apr. 7, 2005

(30) Foreign Application Priority Data

Sep. 30, 2003 (AT) .............................. A 1548/2003

(51) Int. Cl.
*G21K 1/08* (2006.01)
*H01J 3/14* (2006.01)

(52) U.S. Cl. .................. 250/396 R; 250/396 ML; 250/515.1

(58) Field of Classification Search ................ None
See application file for complete search history.

(56) References Cited

U.S. PATENT DOCUMENTS

| | | | | |
|---|---|---|---|---|
| 3,932,749 | A * | 1/1976 | Taylor | 250/306 |
| 4,096,386 | A * | 6/1978 | Rempfer et al. | 250/365 |
| 4,551,599 | A * | 11/1985 | Liebl | 250/396 R |
| 4,963,748 | A | 10/1990 | Szilagyi | |
| 4,985,634 | A | 1/1991 | Stengl et al. | |
| 5,442,183 | A * | 8/1995 | Matsui et al. | 250/441.11 |
| 6,038,018 | A * | 3/2000 | Yamazaki et al. | 356/237.1 |
| 6,580,073 | B2 * | 6/2003 | Plies et al. | 250/305 |
| 6,608,317 | B1 * | 8/2003 | Nakasuji | 250/492.22 |
| 6,940,080 | B2 * | 9/2005 | Nagano et al. | 250/492.23 |

(Continued)

FOREIGN PATENT DOCUMENTS

EP 1306871 A2 2/2003

(Continued)

OTHER PUBLICATIONS

Adler, R.J. et al., "Advances in the Development of the Nested High Voltage Generator", internet: http://www.northstar-research.com/appnotes.html).

(Continued)

*Primary Examiner*—Jack Berman
*Assistant Examiner*—Anthony Quash
(74) *Attorney, Agent, or Firm*—RatnerPrestia

(57) ABSTRACT

In a charged-particle beam exposure device, an electrostatic lens (ML) comprises several (at least three) electrodes with rotational symmetry (EFR, EM, EFN) surrounding a particle beam path; the electrodes are arranged coaxially on a common optical axis representing the center of said particle beam path and are fed different electrostatic potentials through electric supplies. At least a subset of the electrodes (EM) form an electrode column realized as a series of electrodes of substantially equal shape arranged in consecutive order along the optical axis, wherein outer portions of said electrodes (EM) of the electrode column have outer portions (OR) of corresponding opposing surfaces (f1, f2) facing toward the next and previous electrodes, respectively. Preferably, the length of the electrode column is at least 4.1 times (3 times) the inner radius (ri1) of said surfaces (f1, f2).

10 Claims, 4 Drawing Sheets

U.S. PATENT DOCUMENTS

2003/0155534 A1* 8/2003 Platzgummer et al. . 250/492.22
2004/0056207 A1* 3/2004 Petrov et al. ........ 250/396 ML
2005/0104013 A1* 5/2005 Stengl et al. .......... 250/492.21

FOREIGN PATENT DOCUMENTS

| GB | 505601 A | 5/1939 |
|----|----------|--------|
| GB | 925551 A | 5/1963 |
| GB | 2057753 A | 4/1981 |
| GB | 2137803 A | 10/1984 |

OTHER PUBLICATIONS

Elkind, M.M., "Ion Optics in Long, High Voltage Accelerator Tubes", The Review of Scientific Instruments, Feb. 1953, pp. 129-137, vol. 24, No. 2.

Amuneal Mfg. Corp., Magnetic Shield Formulas, internet: http://www.amuneal.com/pages/magshield-formula.php.

* cited by examiner (state of the art)

PARTICLE-OPTIC ELECTROSTATIC LENS

CROSS-REFERENCE TO RELATED APPLICATIONS

This application claims the benefit of Austrian Patent Application Serial No. A 1548/2003, filed 30 Sep. 2003.

FIELD OF THE INVENTION AND DESCRIPTION OF PRIOR ART

The invention relates to improvements in an electrostatic lens in a particle-beam exposure device, in particular a particle-beam lithography apparatus, wherein the electrostatic lens comprises several (i.e., at least three) ring-shaped electrodes with rotational symmetry surrounding a particle beam path, wherein the electrodes are arranged coaxially on a common optical axis representing the center of said particle beam path, and are provided with electric supplies for feeding different electrostatic potentials to the respective electrodes.

Electrostatic lenses of this kind are well known, especially in connection with particle-beam device used for lithography purposes which are mainly employed in semiconductor manufacture processes. A particle-beam apparatus uses a beam of energetic particles—for instance, electrons—to structure a target, such as a semiconductor wafer substrate or a resist-coated wafer. In order to be able to perform this structuring task, the particle beam is formed and directed at selected regions of the target by means of electrostatic and/or electromagnetic lenses. Due to their nature, the performance of electrostatic lenses is gravely affected by electromagnetic fields that are generated in the surroundings of the apparatus and may enter the apparatus where it causes a deviation of the charged particles from the desired path, resulting in optical aberrations which deteriorate the quality of the structures formed on the target.

Therefore, it is a major imperative to shield a particle-beam apparatus from surrounding electromagnetic fields. In particular the shielding of magnetic fields—including the earth magnetic field—is an important issue in the layout of lithography devices. For magnetic shielding, the apparatus in question is surrounded with a shield of a soft-magnetic material, which leads magnetic field lines around the volume to be shielded. Since the handling of voluminous shields is difficult and soft-magnetic materials are expensive, the shielding of charged-particle device is problematic due to the large size of the components—in particular electrostatic lenses—of those devices.

An electrode arrangement with several electrodes of substantially equivalent shape is disclosed in the article of R. J. Adler et al., 'Advance in the Development of the Nested High Voltage Generator', available at http://www.northstar-research.com/appnotes.html. These multielectrode arrangements form an accelerating field for getting high-energy electrons or ions, but not an electrostatic lens for focusing a particle beam. They also do not include the possibility of a magnetic shielding—in fact, R. J. Adler et al. even expressly allow magnetic flux penetration into their device.

SUMMARY OF THE INVENTION

It is an aim of the present invention to facilitate the magnetic shielding of an electrostatic lens system, in particular by reducing the space the lens occupies.

The aim is achieved by an electrostatic lens wherein at least a subset of the electrodes form an electrode column realized as a series of electrodes of substantially equal shape arranged in consecutive order along the optical axis, with outer portions of said electrodes of the electrode column having corresponding opposing surfaces facing toward the next and previous electrodes, respectively. Preferably, the length of the electrode column is at least 4.1 times, or at least 3 times, the inner radius of said surfaces.

The use of multi-electrode columns to replace the electrostatic lenses which, so far, included only a small number of electrodes as far as particle-beam exposure devices are concerned, offers a considerable reduction in the space needed for the electrodes. Furthermore, the provision of outer portions with corresponding surfaces which oppose each other allows to enhance magnetic shielding of the device since the lateral dimension of the electrodes can be chosen according to the dimensions of the other components of the particle-beam device.

Preferably, the outer radius of all electrodes is not larger than 5 times the largest radius of said particle beam path within the lens.

In order to further enhance the magnetic shielding of the particle-beam device, the electrodes of the electrode column may be, at least partially, made from a soft-magnetic material having at environmental conditions a permeability greater than 100; in a preferred variant, the permeability is greater than 300 (relative permeability in SI).

A magnetic shielding is preferably provided by means of an additional magnetic shielding tube made from a soft-magnetic material surrounding the electrode column and extending along the direction of the optical axis at least over the length of the electrode column.

A suitable shaping of the electrodes is realized by providing one outer portion of the electrodes mainly for shielding out external fields, while an inner portion is designed to shape the electrostatic field inside the lens. According to this concept, each electrode of the electrode column comprises an outer member ring having a cylindrical shape with corresponding opposing surfaces facing toward the next and previous electrodes, respectively, and further comprises an inner member ring with a circular edge directed toward the optical axis. In an advantageous variant for avoiding secondary electron effects, the inner member ring may be provided with a concave surface extending outward from the circular edge and facing toward the direction from where the charged particles enter the electrode column.

While gaps are present between opposing surfaces of neighboring electrodes since they are applied different electric voltages, in order to obtain a good magnetic shielding, the width of the gaps are chosen according to the maximal allowable electric voltage between the respective electrodes in view of the electric properties of the residual gas in the charged-particle beam exposure device.

BRIEF DESCRIPTION OF THE DRAWINGS

In the following, the present invention is described in more detail with reference to preferred embodiments of the invention illustrated in the drawings, which show.

DETAILED DESCRIPTION OF THE INVENTION

Figure 1:
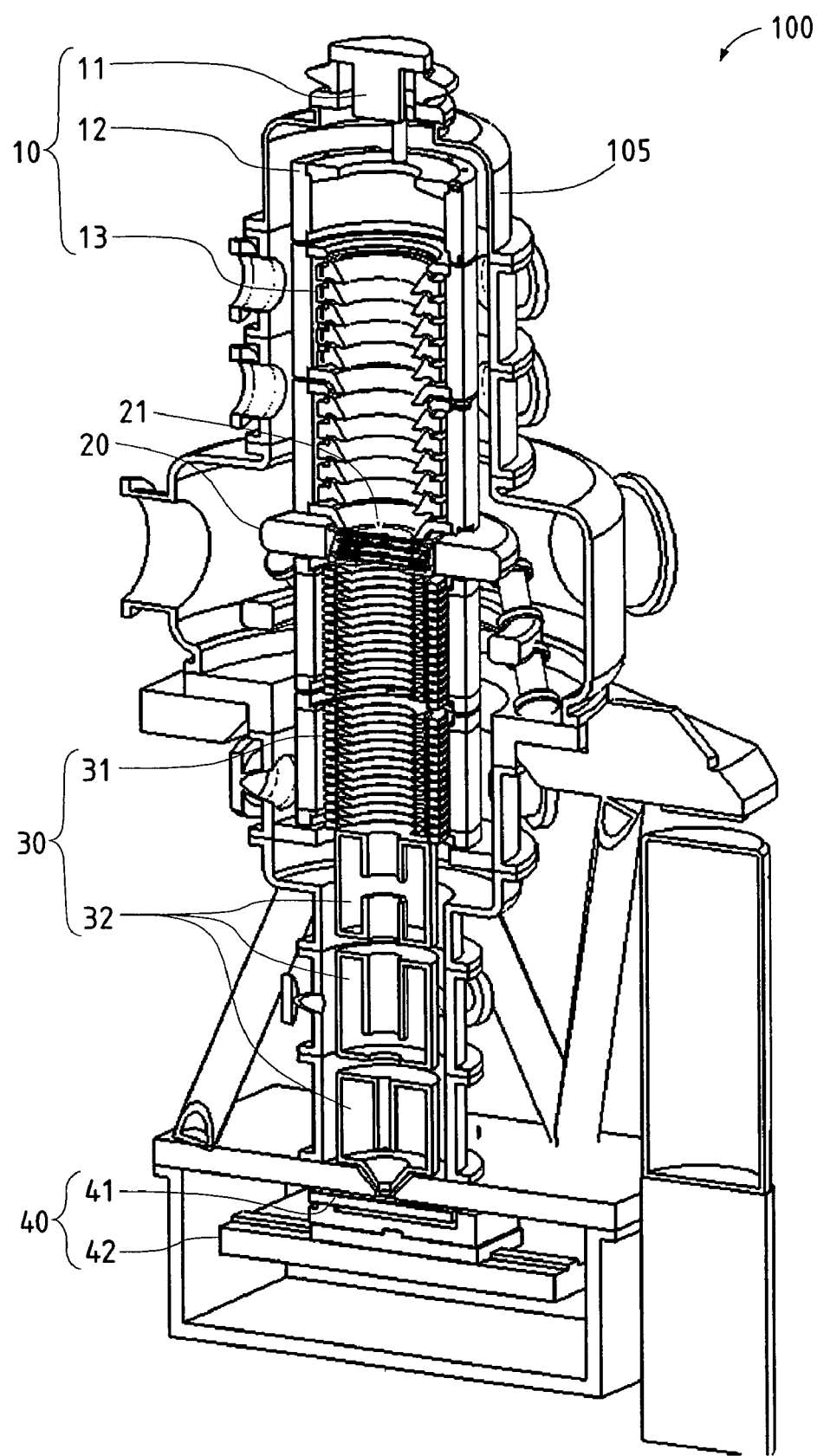
FIG. 1. a schematic overview of a layout of a lithography apparatus to which the invention applies, in a cut-open view.

An overview of an charged-particle-beam lithographic apparatus 100 employing a preferred embodiment of the invention is shown in FIG. 1. In the following, only those details are given as needed to disclose the invention. The main components of the lithography apparatus 100 are— corresponding to the direction of the electron beam which runs vertically downward in FIG. 1—an illumination system 10, a pattern definition system 20, a projecting system 30, and a target station 40 comprising the substrate 41. The whole apparatus 100 is contained in a vacuum housing 105 held at high vacuum to ensure an unimpeded propagation of the beam along the optical axis cx of the apparatus. The particle-optical systems 10, 30 are realized using electrostatic and/or electromagnetic lenses. While the apparatus 100 shown in FIG. 1 is designed for electrons, it should be appreciated that the invention also may be implemented with other charged particles, such as hydrogen ions or heavier ions; such an apparatus is disclosed, e.g., in the U.S. Pat. No. 4,985,634 of the applicant (assignee).

In the apparatus shown, the illumination system 10 comprises an electron gun 11, an extraction system 12 and a condenser lens system 13. The extraction system 12 accelerates the particles (i.e. here, electrons) to a defined energy of typically several keV, e.g. 10 keV. By means of a condenser lens system 13, the electrons emitted from the source 11 are formed into a wide, substantially telecentric particle beam serving as lithography beam. The lithography beam then irradiates a pattern definition device 21 held in a pattern definition system 20 at a specific position in the path of the lithography beam, which thus irradiates a plurality of apertures present in the device 21. Details about a pattern definition device can be found in the US 2003-0155534-A1 of the applicant (assignee). Each of the apertures can be controlled between a "switched on" or "open" state where it is transparent to the incident beam, and a "switched off" or "closed" state, i.e. non-transparent (opaque) to the beam. The pattern of switched-on apertures is chosen according to the pattern to be exposed on the substrate, as these apertures are the only portions of the pattern definition device transparent to the beam, which is thus formed into a patterned beam emerging from the apertures (in FIG. 1, below the pattern definition device).

The pattern as represented by the patterned beam is then projected by means of an electro-magneto-optical projection system 30 onto the substrate 41 where it forms an image of the switched-on apertures 21. In the apparatus of FIG. 1, the projection system 30 comprises two imaging stages composed of an immersion lens 31 followed by three magnetic lenses 32. The substrate 41 is, for instance, a silicon wafer covered with a photo-resist layer. The wafer 41 is mounted to a wafer chuck positioned by means of a wafer stage 42 of the target station 40.

Figure 2:
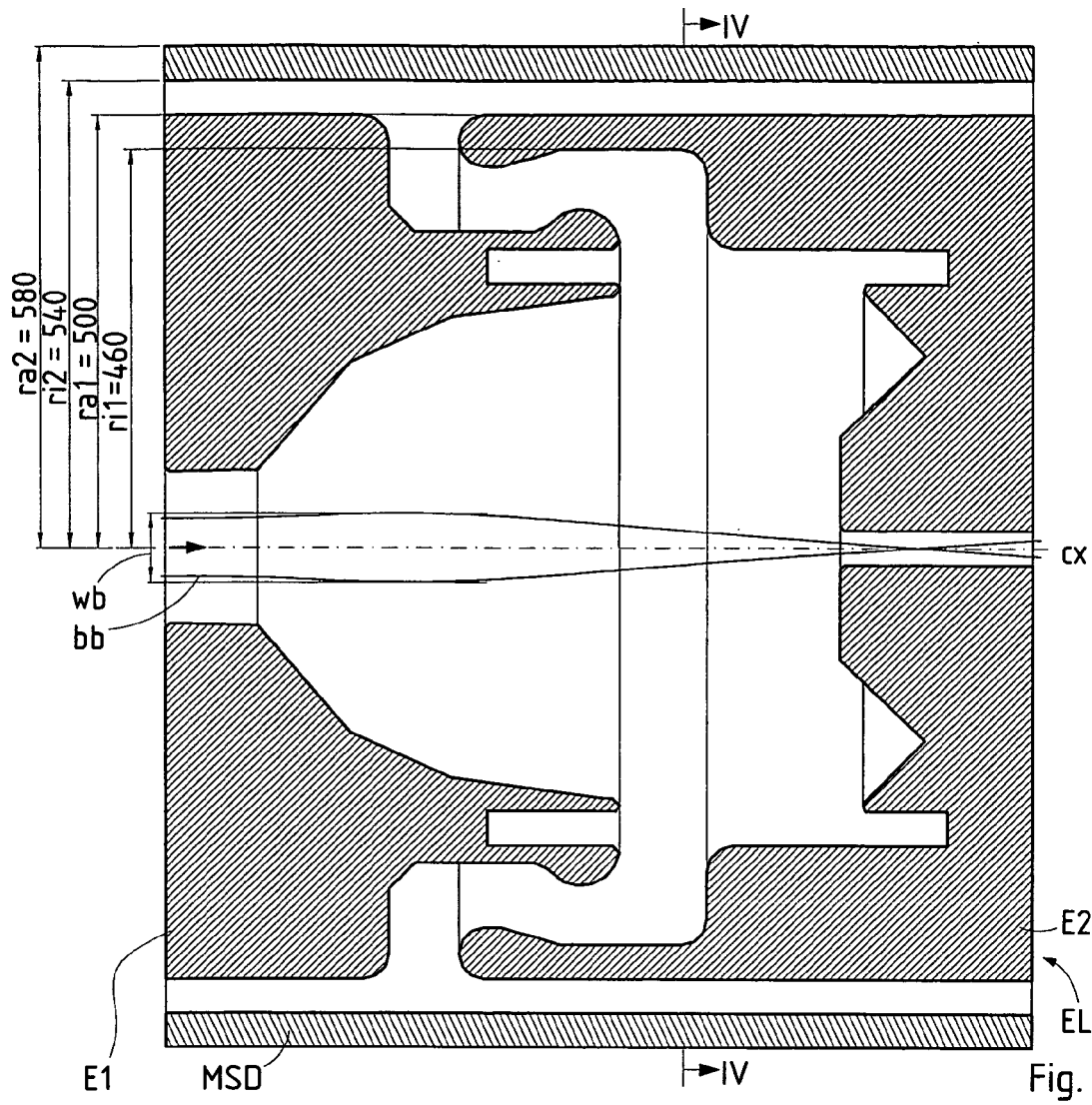
FIG. 2. a state-of-the-art electrostatic lens.

FIG. 2 shows a state-of-the-art shielded immersion lens, composed of an immersion lens EL and a magnetic shielding MSD surrounding the lens, in a longitudinal-sectional view. In the example shown, the lens EL consists of two rotationally symmetric ("ring-shaped") electrodes E1, E2 to which an individual electrostatic potential can be applied, respectively, thus building an electric voltage between the electrodes. The shape of the inner surfaces of the electrodes E1, E2 is designed in such a way to form a desired configuration of the electrostatic field along the path of the electrons (or, in general, charged particles) realizing an electrostatic lens with very low optical aberrations. Also shown in FIG. 2 is an approximate envelope bb of the particle beam which is focused by the lens EL so as to pass the narrow channel formed at the exit side of the electrode E2. The direction of the particles is indicated by an arrow.

Of course, other configurations of focusing are equally well possible with a lens according to the invention, as the invention can be employed for any electrostatic lens used in a particle beam exposure device. One example of an alternative focusing where the invention can prove advantageous is a lens widening the beam from an initial to a greater final width of desired value, as would be the case for a condenser lens which is part of the condenser lens system 13.

As can be seen from FIG. 2, the electrodes E1, E2 consume considerable lateral space, i.e. extending to about 10 times the maximum radius wb of the beam envelope bb. This is problematic with the shielding against magnetic fields of the surroundings—such as the earth magnetic field, stray fields from magnetic devices located in the vicinity of the lithography apparatus—since it is in general easier, and of course much cheaper, to shield arrangements that consume less lateral space. Moreover, it is advantageous if the various particle-optical components (including lenses) which are arranged along the optical axis have the same lateral dimension since this facilitates the provision of efficient magnetic shielding means.

Figure 3:
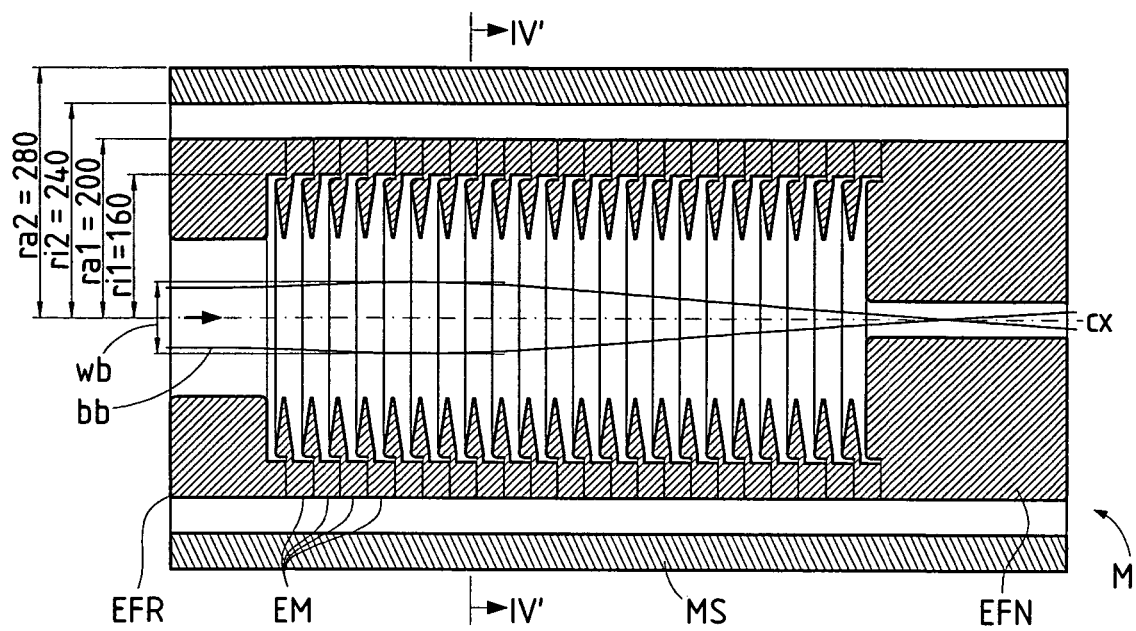
FIG. 3. a multi-electrode lens according to a first embodiment of the invention.

According to the invention a multi-electrode lens ML substitutes for the state-of-the-art immersion lens EL, for instance employing a layout as displayed in the longitudinal section in FIG. 3. The multi-electrode lens comprises an electrode column consisting of a series of electrodes EM of substantially equal shape arranged along the optical axis. A front electrode EFR positioned at the front opening of the lens (i.e., where the electrons enter) and a final electrode EFN positioned at the end opening are provided in order to define the initial and the final electrostatic potentials that the charged particles will be exposed to at entering and leaving the lens ML, respectively. Each of the electrodes EM is provided with its own electric feeding (not shown) for applying an individual electrostatic potential. The individual potential may be generated by means of a resistor array interpolating the individual electrostatic potentials from a small number of potentials supplied, for instance a minimum and a maximum potential. Individual supplies can also be fed directly from a power source (not shown), in particular when the number of electrodes EM is not too high (as, e.g., in FIG. 5).

Figure 3A:
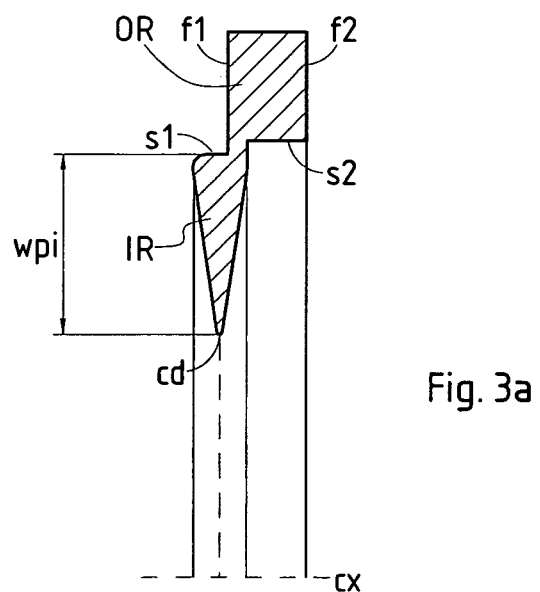
FIG. 3a. a detail of an electrode of FIG. 3.

The shape of a single electrode EM is illustrated in the longitudinal-sectional detail of FIG. 3a. The electrode EM is rotational symmetric around the optical axis, thus forming a ring surrounding the optical path of the electron beam. The electrode is composed of two main parts, namely an outer member ring OR and an inner portion IR protuding from the outer member ring OR inwards, i.e. toward the optical axis. The outer member ring has a cylindrical shape, with a front surface f1 and a back surface f2 which, respectively, face toward the next and previous electrode in the multi-electrode lens series. Between the back surface f2 of each electrode and the front surface f1 of the respective next electrode, a small gap is left. This gap is necessary since an electric voltage is present between the electrodes; the width of the gap is chosen according to the maximal allowable electric voltage between two neighboring electrodes in view of the electric properties of the residual gas in the lithography device.

The inner portion IR of the electrode EM forms an inner member ring which tapers inwards ending in a circular edge cd directed toward the optical axis. In order to obtain a well-defined lens field, the innermost part of the inner portion IR should be thin; however, it should not have a sharp edge in order to avoid field emission of electrons. In view of mechanic stability of the inner portion IR, the thickness should increase with the distance from the optical axis cx, and should be at least 1/10 of the width wpi of the inner portion measured along a radial direction.

The inner member ring IR is joined to the outer member ring OR in a manner that a shoulder s1 is formed which covers the gap between consecutive electrodes. Preferably, in addition to the magnetic shield MS surrounding the lens ML, also the electrodes EM are made from a soft-magnetic material—that is, a magnetic material having a steep but narrow hysteresis loop—with a high permeability at environmental conditions of at least 100, preferably at least 300.

Such materials are well-known from prior-art. For example, soft iron or so-called permalloy may be used as the bulk material for the electrodes EM. In that case, the presence of the outer shoulder s1 helps to prevent magnetic field lines from 'leaking in' into the inner space, since a field line traversing a gap will meet the shoulder s1 and, therefore, enter the magnetic material which will lead the field line around the inner space. At the inner side of the member ring OR, an inner shoulder s2 is present corresponding to the outer shoulder s1, in order to leave space for the inner member ring of the consecutive electrode (not shown in FIG. 3a).

In order to avoid a buildup of charge at insulating layers—which would change the electrode potential—the electrodes are preferably coated with a thin layer of a well conducting material, such as ZrN or TiN.

The effect of magnetic shielding against transverse magnetic fields is usually described in terms of a shielding factor S, defined as the quotient between the magnetic field $B_{out}$ outside the shielding at a distance far away from it, and the magnetic field $B_{in}$ inside the shielding; i.e., $S=B_{out}/B_{in}$. For a single tubular shielding with inner radius ri, outer radius ra and a permeability μ of the shielding material, the shielding factor is $$S=(1-ri^2/ra^2)\cdot\mu/4.$$

Figure 4:
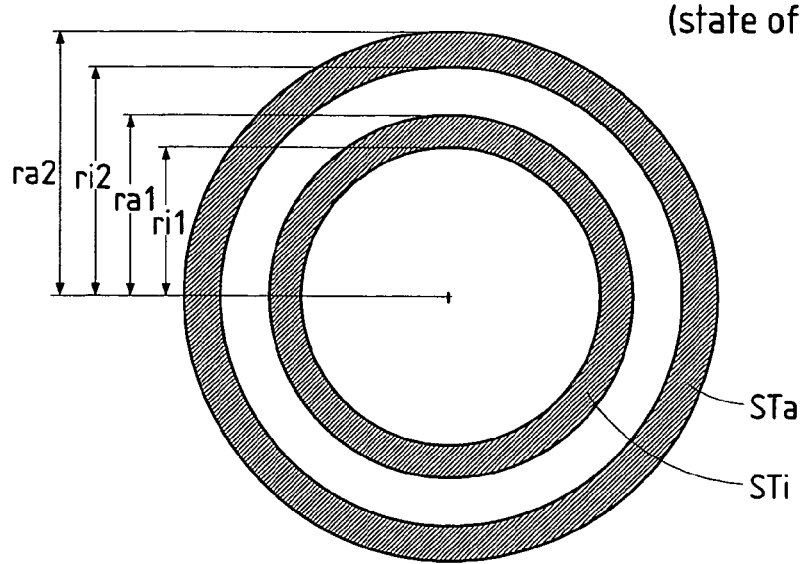
FIG. 4. the principle of magnetic shielding realized in two concentric shield tubes.

For a double shielding as illustrated in the cross sectional view of FIG. 4, a total shielding factor $S^{(2)}$ results according to $$S^{(2)}=1+S1+S2+S1\cdot S2\cdot N,$$

wherein $S1=(1-ri1^2/ra1^2)\cdot\mu 1/4$ is the shielding factor of the inner shield tube STi made from a material with permeability μ1, $S2=(1-ri2^2/ra2^2)\cdot\mu 2/4$ is the shielding factor of the outer shield tube STa of a material having permeability μ2, and the geometric factor $$N=1-ra1^2/ri2^2$$

takes into account the spacing between the two shields STi, STa.

Applying this formula to the electrostatic lenses EL, ML of FIGS. 2 and 3 respectively, the structure that is to be shielded is the volume around the optical axis, inside the electrostatic lens, comprising the envelope bb. As already explained, the lens EL, ML consists of two or more electrodes E1,E2, EFR,EM,EFN, with a voltage applied between them. In the following, we discuss a comparison of the conventional two-electrode lens EL of FIG. 2 with the multi-electrode lens ML according to the embodiment of the invention shown in FIG. 3.

For both cases it is assumed that the electrodes E1,E2, EFR,EM,EFN are made from the same ferromagnetic material, thus forming the inner layer of the magnetic shielding. Because of the voltage, there must be a gap between the electrodes E1,E2, EFR,EM,EFN, which reduces the effect of this magnetic shielding layer. It is easier to provide a sufficient spacing between the electrodes with the multielectrode lens ML, because there the voltage is divided into a number of smaller amounts and the gap between the electrodes can be much smaller.

In both cases it is assumed that the inner layer has an effective permeability of μ1=300. For the second shielding layer MSD, MS, a permeability of μ2=1000 is assumed. The geometric and permeability values may be different in other implementations of the invention, without affecting the principle of the invention. The geometric values of the radii that enter the shielding factor formulae are taken at the sections denoted by the lines IV, IV' in FIGS. 2 and 3, respectively.

With the values given for this example, the total magnetic shielding $S^{(2)}$ is about 100 for the lens EL of prior-art whereas it is about 640 for the multi-electrode lens ML. This means that a shielding factor is obtained which is more than six times higher with less than half of the material as compared to the state-of-the art lens providing the same configuration of the electric field.

In FIG. 3 the length of the electrode column formed by the electrodes EM is about 4.1 times the inner radius ri 1 of the outer portion of the electrodes or, equivalently, of their front and back surfaces f1, f2. Suitable values of this proportion are values greater than 3.

Even if the electrodes are not made of a ferromagnetic material and therefore are not part of the magnetic shielding (single shielding), still a two times higher shielding factor S is obtained with less than half of the material in case of the multi-electrode lens due to the smaller geometry of the outer shield. So in this case as well, the reduction of the diameter gives a substantial advantage for the magnetic shielding.

From the experience in electrostatic linear particle accelerators, it is known that the production of secondary electrons at the acceleration electrodes may lead to electron multiplication, an effect comparable to that exploited in a secondary electron multiplier. The increasing amount of electrons in the accelerator tube leads to increasing current through the electrodes which induces voltage instability until possible voltage breakdown.

In a charged-particle optical system of the invention, secondary electrons will also be responsible for other undesired effects, such as charging up of insulators and insulating layers and thereby deteriorating the optical performance, or creation of secondary positive ions which will be accelerated towards the object (mask, aperture plate or the like) to be imaged.

Therefore, it is important to minimize the number of secondary electrons emitted into the optical column. This is done by shaping the (radial symmetric) electrodes in a way that the electric field at the "rear" side of the electrode, i.e. the electrode surface oriented towards the higher energy, accelerates the secondary electrons emitted from this electrode surface directly to the next electrode, i.e. to the "front" surface facing the emitting surface. To this effect, close to the electrode hole (through which the charged particles travel), the rear surface of each electrode should be basically conical, with the cross section line of the cone optionally being curved, the base of the cone lying towards the low energy end of the system. Secondary electrons produced at the "front" surface, the one oriented towards the low energy end, of the electrodes will be accelerated back to this surface and have no chance to enter the optical column or to be multiplied.

Figure 5:
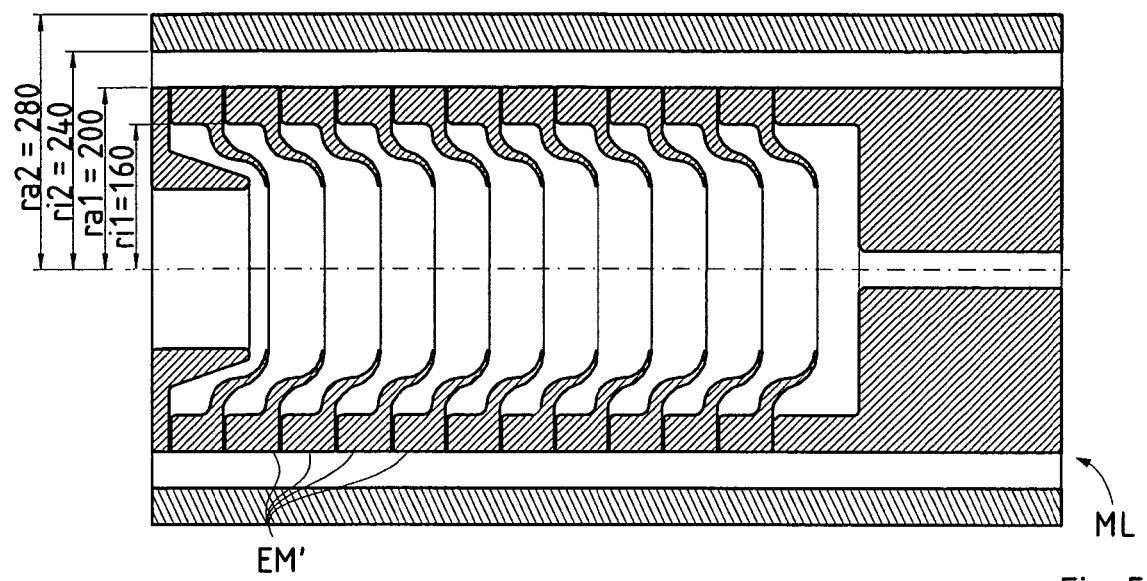
FIG. 5. a multi-electrode lens of a second embodiment.

For avoidance of such secondary electron effects, in another preferred embodiment of the invention shown in FIG. 5, the inner portion IR' of the electrodes EM' have a curved shape. The inner portion IR' is provided with a concave surface cv extending outward from the circular edge cd. It is oriented so as to face toward the direction from where the charged particles enter the electrode column.

Figure 5A:
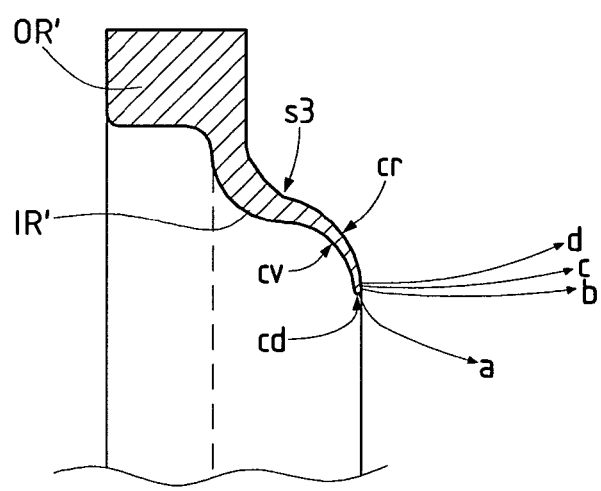
FIG. 5a. a detail of an electrode of FIG. 5.

In FIG. 5a, one electrode is shown in more detail, together with the directions of some 1 eV electrons starting from the electrode surface. As can be seen from FIG. 5a, the "conical" behavior of the rear surface cross section line cr starts only at a distance from the innermost radius of the electrode (the radius of the open width of the electrode as seen along the optical axis of the electrode), since the contour of the edge cd is shaped as a circle cd of finite dimension. The minimum radius of the circle cd is determined by the maximum field strength allowed in vacuum, so as to avoid sparkling from the electrode.

Examples of electron trajectories are sketched in FIG. 5a, of which only the electron labeled 'a' will be emitted into the inner part of the optical column, whereas electrons 'b', 'c' and 'd' will be accelerated towards the front surface of the neighboring electrode.

In the embodiment shown in FIG. 5a, the cross section lines of the inner part of the 'front' surface cv and the 'rear' surface cr are also circular. The radii of the circles are chosen according to material stability as well as high voltage stability criteria. Shapes different from circles may also be chosen, e.g. straight lines corresponding to "standard" cone segments when rotated around the symmetry axis, at the expense that the region from which secondary electrons are emitted into the optical column is a little bit larger. In the embodiment of FIGS. 5 and 5a, the inner portion IR' extends over the outer member ring OR' at the back side, so it is now the curved surface s3 at the backside of the inner portion IR' which serves as shoulder preventing disturbing electrostatic field lines from 'leaking in' through the gap that is formed between the outer member rings OR' of consecutive electrodes.

Similar to the immersion lens of the projection system of the apparatus shown in FIG. 1, the magnetic shielding of the electrostatic condenser lens can be improved by the principles of the invention. The state of the art condenser lens would be a three-electrode Einzel lens, the radius of which would again be about 10 times the maximum radius of the beam envelope (this maximum radius will be attained close to the pattern definition device 20). Applying the invention reduces this radius by the same amount as for the immersion lens, viz. by a factor of 2.

We claim:

1. An electrostatic lens in a charged-particle beam exposure device, comprising at least three electrodes with rotational symmetry surrounding a particle beam path, wherein the electrodes are arranged coaxially on a common optical axis representing the center of said particle beam path, and are provided with electric supplies for feeding different electrostatic potentials to the respective electrodes, wherein at least a subset of the electrodes form an electrode column realized as a series of electrodes of substantially equal shape arranged in consecutive order along the optical axis, said electrodes of the electrode column having outer portions with surfaces facing toward corresponding opposing surfaces of outer portions of the next and previous electrodes, respectively, and said electrodes of the electrode column being at least partially made from a soft-magnetic material having at environmental conditions a permeability greater than 100.

2. The electrostatic lens of claim 1, wherein a length of the electrode column is at least 4.1 times an inner radius of said surfaces.

3. The electrostatic lens of claim 1, wherein a length of the electrode column is at least 3 times an inner radius of said surfaces.

4. The electrostatic lens of claim 1, wherein the electrodes have a shoulder between their outer portion and an inner portion extending inwards from the outer portion, said shoulder covering a gap formed between one of the opposing surfaces of the respective electrode and a corresponding opposing surface of a neighboring electrode.

5. The electrostatic lens of claim 1, wherein the permeability is greater than 300.

6. The electrostatic lens of claim 1, further comprising a magnetic shielding tube made from a soft-magnetic material surrounding the electrode column and extending along the direction of the optical axis at least over the length of the electrode column.

7. The electrostatic lens of claim 1, wherein each electrode of the electrode column comprises an outer portion formed as an outer member ring having a cylindrical shape with corresponding opposing surfaces facing toward the next and previous electrodes, respectively, and further comprises an inner member ring with a circular edge directed toward the optical axis.

8. The electrostatic lens of claim 7, wherein the inner member ring is provided with a concave surface extending outward from the circular edge and facing toward a direction from where charged particles enter the electrode column.

9. The electrostatic lens of claim 1, wherein an outer radius of all of the electrodes is not larger than 5 times a largest radius of said particle beam path within the lens.

10. The electrostatic lens of claim 1, wherein gaps are present between opposing surfaces of neighboring electrodes, the width of the gaps chosen according to the maximal allowable electric voltage between the respective electrodes in view of the electric properties of a residual gas in the charged-particle beam exposure device.

* * * * *